(12) United States Patent
Lin et al.

(10) Patent No.: US 9,541,948 B2
(45) Date of Patent: Jan. 10, 2017

(54) DETECTING CIRCUIT AND CONFIGURATION STATUS DETECTING METHOD OF REAL-TIME CLOCK BATTERY AND ELECTRONIC APPARATUS USING THE SAME

(71) Applicant: Wistron Corporation, New Taipei (TW)

(72) Inventors: Chih-Yang Lin, New Taipei (TW); Ming-Chen Chiu, New Taipei (TW); I-Ta Tseng, New Taipei (TW)

(73) Assignee: Wistron Corporation, New Taipei (TW)

( * ) Notice: Subject to any disclaimer, the term of this patent is extended or adjusted under 35 U.S.C. 154(b) by 364 days.

(21) Appl. No.: 14/174,852

(22) Filed: Feb. 7, 2014

(65) Prior Publication Data

US 2015/0106643 A1    Apr. 16, 2015

(30) Foreign Application Priority Data

Oct. 15, 2013    (TW) .............................. 102137149 A

(51) Int. Cl.
*G06F 1/00* (2006.01)
*G06F 11/30* (2006.01)
(Continued)

(52) U.S. Cl.
CPC .............. *G06F 1/14* (2013.01); *G01R 19/0084* (2013.01); *G01R 19/16542* (2013.01);
(Continued)

(58) Field of Classification Search
CPC .................... G01R 19/16542; G01R 19/0084; G01R 31/2813; G01R 31/40; G06F 1/26; G06F 1/28
See application file for complete search history.

(56) References Cited

U.S. PATENT DOCUMENTS 5,811,895 A    9/1998    Suzuki et al.
5,838,171 A *  11/1998   Davis ............... G01R 19/16538
                                                        327/19
(Continued)

FOREIGN PATENT DOCUMENTS

TW    431620    4/2001

OTHER PUBLICATIONS

"Office Action of Taiwan Counterpart Application", issued on Mar. 9, 2015, with English translation thereof, p. 1-p. 14.

*Primary Examiner* — Thomas Lee
*Assistant Examiner* — Zhipeng Wang
(74) *Attorney, Agent, or Firm* — Jianq Chyun IP Office

(57) ABSTRACT

A detecting circuit and a configuration status detecting method of a Real-Time Clock (RTC) battery and an electronic apparatus using the same are provided. The detecting circuit includes a power capturing unit, a voltage dividing unit and an output unit. The power capturing unit couples to a power supply output terminal of the RTC battery and captures a power supply signal from the power supply output terminal in response to a detecting-controlled signal. The voltage dividing unit couples to the power capturing unit and is configured to divide the power supply signal captured by the power capturing unit to generate a dividing signal. The output unit couples to the voltage dividing unit to receive the dividing signal, where the output unit generates a detecting result signal related to a configuration status of the RTC battery according to the dividing signal.

8 Claims, 5 Drawing Sheets

(51) Int. Cl.
*G06F 1/14* (2006.01)
*G01R 19/165* (2006.01)
*G01R 31/40* (2014.01)
*G01R 31/28* (2006.01)
*G06F 1/28* (2006.01)
*G01R 19/00* (2006.01)
*G06F 1/26* (2006.01)
*G04G 19/02* (2006.01)
*G04G 19/08* (2006.01)

(52) U.S. Cl.
CPC ......... *G01R 31/2813* (2013.01); *G01R 31/40* (2013.01); *G04G 19/02* (2013.01); *G04G 19/08* (2013.01); *G06F 1/26* (2013.01); *G06F 1/28* (2013.01)

(56) References Cited

U.S. PATENT DOCUMENTS

| | | | | |
|---|---|---|---|---|
| 5,877,628 | A * | 3/1999 | Yeh | G01R 19/16542 324/427 |
| 5,905,365 | A * | 5/1999 | Yeh | H02J 7/345 307/66 |
| 6,359,547 | B1 * | 3/2002 | Denison | B60R 25/102 340/5.73 |
| 2006/0255958 | A1 * | 11/2006 | Jiang | H02J 7/0047 340/636.1 |
| 2009/0259860 | A1 * | 10/2009 | Hu | G06F 1/26 713/300 |
| 2011/0289123 | A1 * | 11/2011 | Denison | G07F 11/002 707/812 |
| 2013/0311120 | A1 * | 11/2013 | Lin | G01R 19/0084 702/64 |

\* cited by examiner

DETECTING CIRCUIT AND CONFIGURATION STATUS DETECTING METHOD OF REAL-TIME CLOCK BATTERY AND ELECTRONIC APPARATUS USING THE SAME

CROSS-REFERENCE TO RELATED APPLICATION

This application claims the priority benefit of Taiwan application serial no. 102137149, filed on Oct. 15, 2013. The entirety of the above-mentioned patent application is hereby incorporated by reference herein and made a part of this specification.

BACKGROUND

Field of the Application

The invention relates to a detection technology of an electronic apparatus, and more particularly, to a detecting circuit and a configuration status detecting method of a Real-Time Clock (RTC) battery and an electronic apparatus using the same.

Description of Related Art

In an electronic apparatus, in order to ensure that system date and time information can be continuously calculated in an shut-down state, or prevent some important information from being cleared following System Shutdown, a separate battery is commonly configured on a motherboard of the electronic apparatus for supplying power to electronic components with specific functions, such as a Real-Time Clock Chip (RTC Chip) configured to calculate the system time and a Complementary Metal Oxide Semiconductor RAM (CMOS RAM) configured to store system parameter settings (i.e., BIOS setting), so as to achieve effects of sustainable operations during the System Shutdown. And, this type of battery is commonly referred as a Real-Time Clock (RTC) battery.

In the process of assembling electronic apparatus, the RTC battery may fall off from the motherboard or result in an abnormal connection with other circuit elements/lines when being affected by the impact of external forces, thereby causing the RTC battery unable to properly supply power to the corresponding electronic component. And, this would result in abnormal operation of electronic apparatus.

Under a general detection procedure of the electronic apparatus, an inspector can only ensure whether the abnormal condition is caused by the falling off of the RTC battery through a teardown inspection approach when finding the operation of the electronic apparatus to be abnormal. However, actions of the teardown inspection inevitably reduce efficiency of the inspection process and bring extra workload inspector. In addition, in the process of teardown inspection, other components of the electronic apparatus may also be damaged due to other anthropogenic causes.

SUMMARY OF THE APPLICATION

The invention provides a detecting circuit and a configuration status detecting method of a RTC battery and an electronic apparatus using the same which may detect whether the configuration status of the RTC battery is normal under the premise of not requiring a teardown inspection.

The detecting circuit of the RTC battery of the invention includes a power capturing unit, a voltage dividing unit and an output unit. The power capturing unit couples to a power supply output terminal of the RTC battery and captures a power supply signal from the power supply output terminal in response to a detecting-controlled signal. The voltage dividing unit couples to the power capturing unit and is configured to divide the power supply signal captured by power capturing unit to generate a dividing signal. The output unit couples to the voltage dividing unit to receive the dividing signal, wherein the output unit generates a detecting result signal related to a configuration status of the RTC battery according to the dividing signal.

In an embodiment of the invention, if the level of the dividing signal is greater than or equal to a threshold, the output unit outputs the enabled detecting result signal in response to the dividing signal, wherein the enabled detecting result signal indicates that the RTC battery is in a normal configuration state; and if the level of the dividing signal is smaller than the threshold, the output unit outputs the disabled detecting result signal in response to the dividing signal, wherein the disabled detecting result signal indicates that the RTC battery is in an abnormal configuration state.

In an embodiment of the invention, the voltage dividing unit includes a first resistor and a second resistor. A first terminal of the first resistor couples to the power capturing unit. A first terminal of the second resistor couples to a second terminal of the first resistor, and a second terminal of the second resistor couples to a ground terminal.

In an embodiment of the invention, the output unit includes a first bias source, a first bias resistor and a first transistor. The first bias resistor has a first terminal coupled to the first bias source. A control terminal of the first transistor couples to the second terminal of the first resistor and the first terminal of the second resistor. A first terminal of the first transistor couples to a second terminal of the first bias resistor and outputs the detecting result signal. A second terminal of the first transistor couples to the ground terminal.

In an embodiment of the invention, the power capturing unit includes a second transistor. A control terminal of the second transistor receives the detecting-controlled signal. A first terminal of the second transistor couples to the power supply output terminal to receive the power supply signal. A second terminal of the second transistor couples to the first terminal of the first resistor.

In an embodiment of the invention, the power capturing unit includes a second bias source, a second bias resistor, a second transistor, and a third transistor. A first terminal of the second bias resistor couples to the second bias source. A control terminal of the second transistor couples to a second terminal of the second bias resistor. A first terminal of the second transistor couples to the power supply output terminal to receive the power supply signal. A second terminal of the second transistor couples to the first terminal of the first resistor. A control terminal of the third transistor receives the detecting-controlled signal. A first terminal of the third transistor couples to the second terminal of the second bias resistor and the control terminal of the second transistor. A second terminal of the third transistor couples to the ground terminal.

In an embodiment of the invention, the power supply output terminal of the RTC battery is adapted to be coupled to a Schottky diode, so as to supply power to at least one electronic component via the Schottky diode.

The electronic apparatus of the invention includes at least one component, a battery module, a detecting circuit, and a controller. The battery module is adapted to supply power to the said electronic component, wherein the battery module includes a RTC battery and a Schottky diode. The RTC battery has a power supply output terminal. The Schottky diode couples between the power supply output terminal and the said electronic component. The detecting circuit couples to the battery module, wherein the detecting circuit includes a power capturing unit, a voltage dividing unit and an output unit. The power capturing unit couples to the power supply output terminal of the RTC battery and captures a power supply signal from the power supply output terminal in response to a detecting-controlled signal. The voltage dividing unit couples to the power capturing unit and is configured to dive the power supply signal captured by the power capturing unit to generate a dividing signal. The output unit couples to the voltage dividing unit to receive the dividing signal, wherein the output unit generates a detecting result signal according to the dividing signal. The controller is configured to provide the detecting-controlled signal for controlling the operation of the detecting circuit and to receive the detecting result signal for determining a configuration status of the RTC battery.

In an embodiment of the invention, the Schottky diode has a first anode terminal, a second anode terminal and a cathode terminal. The first anode terminal couples to an auxiliary bias source, the second anode terminal couples to power supply output terminal, and the cathode terminal couples to the said electronic component.

In an embodiment of the invention, if the level of the dividing signal is greater than or equal to a threshold, the output unit outputs the enabled detecting result signal in response to the dividing signal, wherein the controller determines that the RTC battery is in a normal configuration state according to the enabled detecting result signal; and if the level of the dividing signal is smaller than the threshold, the output unit outputs the disabled detecting result signal in response to the dividing signal, wherein the controller determines that the RTC battery is in an abnormal configuration state according to the disabled detecting result signal.

The configuration status detecting method of the RTC battery of the invention includes the following steps. A power supply signal is captured from a power supply output terminal of the RTC battery in response to a detecting-controlled signal. The captured power supply signal is divided, so that a dividing signal is accordingly generated. A detecting result signal related to a configuration status of the RTC battery is generated according to the dividing signal.

In an embodiment of the invention, the step of generating the detecting result signal related to the configuration status of the RTC battery according to the dividing signal includes: determining whether the level of the dividing signal is greater than or equal to a threshold; if the level of the dividing signal is greater than or equal to the threshold outputting the enabled detecting result signal, wherein the enabled detecting result signal indicated that the RTC battery is in a normal configuration state; and if the level of the dividing signal is smaller than the threshold, outputting the disabled detecting result signal, wherein the disabled detecting result signal indicated that the RTC battery is in an abnormal configuration state.

In view of above, the embodiments of the invention provide a detecting circuit and a configuration status detecting method of a RTC battery and an electronic apparatus using the same. The detecting circuit may be used to detect whether the RTC battery is correctly configured in the electronic apparatus, so that an inspector is not required to confirm the configuration status of the RTC battery through a complicated teardown inspection procedure, thereby improving efficiency of a testing process. In addition, since the detecting circuit uses the power supply signal being divided as a basis for determining whether the RTC battery is correctly configured in the electronic apparatus, false determination due to reverse leakage from the Schottky diode in the battery module may be avoided, thus improving detection accuracy.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
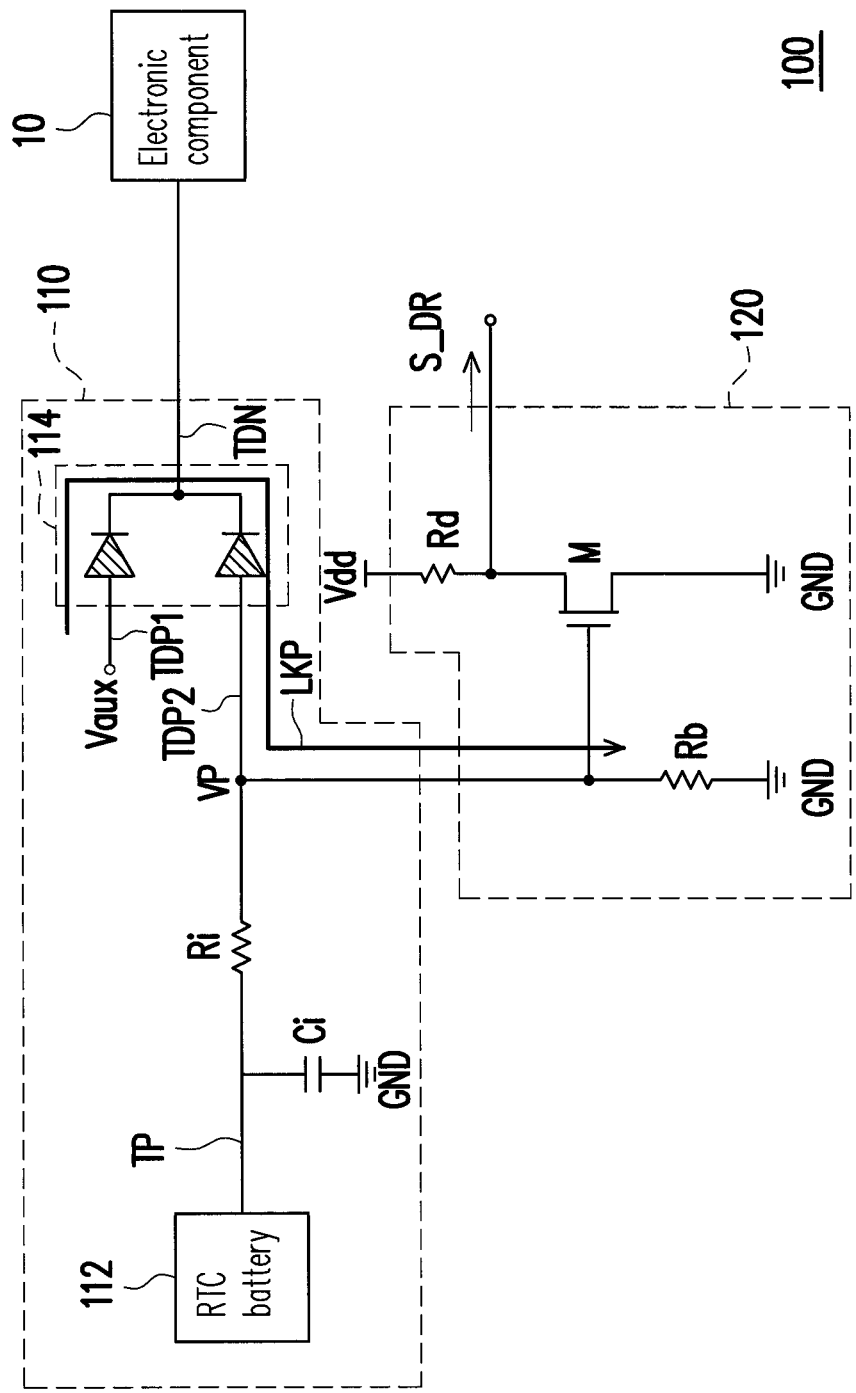
FIG. 1 is a schematic diagram illustrating an electronic apparatus with a RTC battery detecting circuit.

Present embodiment of the invention provides a detecting circuit and a configuration status detecting method of a Rea-Time Clock (RTC) battery, and an electronic apparatus using the same. The detecting circuit may be used to detect whether the RTC battery is correctly configured in the electronic apparatus, so that an inspector is not required to confirm the configuration status of the RTC battery through a complicated teardown inspection procedure, thereby improving efficiency of a testing process and detection accuracy. In order to make content of the present disclosure more comprehensible, embodiments are described below as the examples to prove that the present disclosure can actually be realized. Moreover, elements/components/steps with same reference numerals represent same or similar parts in the drawings and embodiments.

FIG. 1 is a schematic diagram illustrating an electronic apparatus with a RTC battery detecting circuit. Referring to FIG. 1, an electronic apparatus 100 includes a battery module 110, a detecting circuit 120 and at least one electronic component (in the present embodiment, the electronic component 10 is being taken as an example), wherein the battery module 110 couples to the electronic component 10, and the detecting circuit 120 couples to the battery module. In the present embodiment, the electronic apparatus 100 may, for example, be an electronic apparatus such as desktop computer, notebook computer, tablet PC, personal digital assistant (PDA) or smart phone. The electronic component 10 may, for example, be a RTC Chip, a CMOS RAM or other electronic component within the electronic apparatus, but the invention is not limited thereto.

In detail, the battery module 110 of the invention includes a RTC battery 112 and a Schottky diode 114, wherein a power supply output terminal TP of the RTC battery 112 couples to the Schottky diode 114 via an input capacitor Ci and an input resistor Ri, and then couples to the electronic component 10 via the Schottky diode 114, so as to supply power to the electronic component 10. More specifically, in an exemplary embodiment, the Schottky diode 114 may, for example, be a three-terminal Schottky diode having two anode terminals TDP1, TDP2 and a cathode terminal TDN, wherein the anode terminal TDP1 couples to the auxiliary bias source Vaux, the anode terminal TDP2 couples to the power supply output terminal TP of the RTC battery 112, and the cathode terminal TDN couples to the electronic component 10.

In addition, in order to detect the configuration status of the RTC battery 112, the detecting circuit 120 captures a power supply signal VP from a common node of the RTC battery 112 and the Schottky diode 114, and generates a corresponding detecting result signal S_DR according to the power supply signal VP for providing to a controller (not shown), so that to enable the controller to determine whether the RTC battery 112 is properly configured in the battery module 110 according to the detecting result signal S_DR.

For instance, if the detecting circuit 120 captures the power supply signal VP (e.g., 3.3V) at a high level, then this indicates that the RTC battery 112 is currently in a normal configuration state (viz., a state in which the RTC battery 112 is properly connected with other circuit elements/lines and may properly supply power to the electronic component 10), and thus the detecting circuit 120 generates the enabled detecting result signal S_DR according to the power supply signal VP, so that the controller determines the RTC battery 112 to be in the normal configuration state; contrarily, if the detecting circuit 120 captures the power supply signal VP (e.g., 0V) at a low level, then this indicates that the RTC battery 112 is in an abnormal configuration state (viz., a state in which that the RTC battery 112 is shedded or has an abnormal connection (e.g. disconnection or short circuit) with the other circuit elements/lines, thereby causing the RTC battery 112 unable to properly supply power to the electronic component 10) and thus the detecting circuit 120 generates the disabled detecting result signal S_DR according to the power supply signal VP, so that the controller determines the RTC battery 112 to be in the abnormal configuration state.

More specifically, taken the electronic apparatus 100 illustrated in FIG. 1 as an example, the detecting circuit 120 may be implemented using a circuit structure composed of a bias source Vdd, a bias resistor Rd, a resistor Rb, and a transistor M. When the RTC battery 112 is in the normal configuration state, the transistor M is turned-on in response to the power supply signal VP having high level, and accordingly outputs the detecting result signal S_DR having low level; contrarily, when the RTC battery 112 is in the abnormal configuration state, the transistor M is cut-off in response to the power supply signal VP having low level, and accordingly outputs the detecting result signal S_DR having high level. In this exemplary embodiment, the enabled/disabled detecting result signal S_DR is separately represented by a low level/high level signal, but the invention is not limited thereto. Based on the above-described circuit configuration and activation, the electronic apparatus 100 of the present embodiment may then attain a detection mechanism of detecting whether the under the RTC battery 112 is properly configured under premise of not requiring a teardown inspection.

However, under the structure of the detecting circuit 120 shown in FIG. 1, circuit characteristics of the Schottky diode 114 may cause the detecting circuit 120 to false determine the configuration status of the RTC battery 112.

In detail, even though the Schottky diode 114 has an advantage of lower breakover voltage, but relatively, it may have a problem of generating reverse leakage. More specifically, the Schottky diode 114, when generating the reverse leakage, establishes a leakage path LKP between an auxiliary bias source Vaux and a ground terminal GND through the anode terminal TDP2 and the resistor Rb, so that the power supply signal VP carries leakage components caused by the auxiliary bias source Vaux. Wherein, since the reverse leakage current of the Schottky diode 114 has a positive temperature characteristic (viz., a reverse conducting bias voltage is to be lowered following the rise in temperature), the leakage components of the power supply signal VP are increased following the rise in temperature.

In other words, under the consideration to the reverse leakage of the Schottky diode 114, the power supply signal VP captured by the detecting circuit 120 substantially includes power supply output components provided by the RTC battery 112 and the leakage components caused by the auxiliary bias source Vaux at the same time. Under this condition, once the temperature reaches a certain degree, even if the RTC battery 112 is in the abnormal configuration state and is unable to properly supply power, the transistor M in the detecting circuit 120 would still be turned-on in response to the leakage components to the power supply signal VP, and thus the controller is to false determine that the RTC battery 112 is in the normal configuration state.

In addition, based on the structure of the detecting circuit 120, the RTC battery 112, even if under the condition of not requiring inspection, still continues to supply power through the resistor Rb, and thus results in unnecessary power consumption, thereby shortening the service life of the RTC battery 112.

Figure 2:
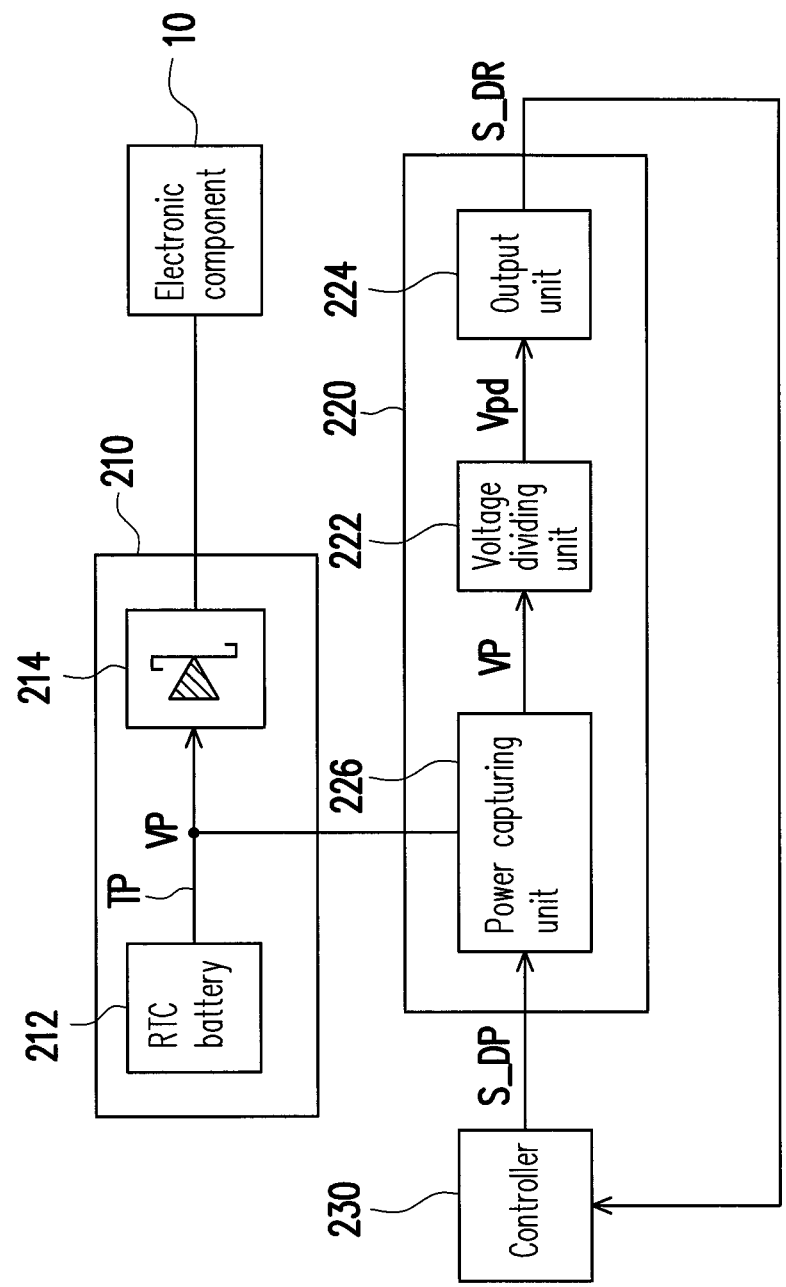
FIG. 2 is a schematic diagram illustrating an electronic apparatus with a RTC battery detecting circuit according to an embodiment of the invention.

In response to the above-mentioned problems, another detecting circuit of the RTC battery, as shown in FIG. 2, is further provided in an embodiment of the invention. Wherein, FIG. 2 is a schematic diagram illustrating an electronic apparatus with a RTC battery detecting circuit according to an embodiment of the invention.

Referring to FIG. 2, an electronic apparatus 200 includes a battery module 210, a detecting circuit 220, a controller 230, and at least one electronic component (in the present embodiment, the electronic component 10 is also being taken as an example), wherein the battery module 210 couples to the electronic component 10, the detecting circuit 220 couples to the battery module, and the controller 230 couples to the detecting circuit 220.

In the present embodiment, the battery module 210 includes a RTC battery 212 and a Schottky diode 214 (similar to the previously-described battery module 110). The detecting circuit 220 includes a voltage dividing unit 222, an output unit 224 and a power capturing unit 226. The controller 230 is configured to provide the detecting-controlled signal S_DP for controlling the operation of the detecting circuit 220 and to receive detecting result signal SDR generated by the detecting circuit 220 for determining the configuration status of the RTC battery 112.

In detail, the power capturing unit 226 couples to the power supply output terminal TP of the RTC battery 212 and captures the power supply signal VP from the power supply output terminal TP in response to the detecting-controlled signal S_DP emitted by the controller 230. The voltage dividing unit 222 couples to the power capturing unit 226 and is configure to divide the power supply signal VP captured by the power capturing unit 226 to generate the dividing signal Vpd. The output unit 224 couples to the voltage dividing unit 222 to receive the dividing signal Vpd and generates the detecting result signal S_DR for the controller 230 according to the dividing signal Vpd.

In the present embodiment, if the level of the dividing signal Vpd is greater than or equal to a threshold, then the output unit 224 is to be enabled in response to the dividing signal Vpd, and according outputs the enabled detecting result signal S_DR to indicate that the RTC battery 212 is in the normal configuration state; contrarily, if the level of the dividing signal Vpd is smaller than the threshold, then the output unit 224 is to be disabled in response to the dividing signal Vpd, and accordingly outputs the disabled detecting result signal S_DR to indicate that the RTC battery 212 is in the abnormal configuration state.

More specifically, since the output unit 224 of the present embodiment generates the detecting result signal S_DR related to the configuration status of the RTC battery 212 according to the divided power supply signal VP (viz., the dividing signal Vpd), and the level of the dividing signal Vpd may be changed by adjusting the dividing setting of the voltage dividing unit 222, by properly adjusting the dividing setting of the voltage dividing unit 222, the divided leakage components are not sufficient to influence the disable/enable status of the output unit 224 even if the power supply signal VP carries the leakage components due to the reverse leakage of the Schottky diode 214, and thus the output unit 224 would not generate a false detecting result signal S_DR because of the reverse leakage of the Schottky diode 214. Hence, as compared to the detecting circuit 120 of the previous embodiment shown in FIG. 1, the detecting circuit 220 of the present embodiment may effectively resolve false-positive detection caused by the reverse leakage of the Schottky diode 214.

In addition, in the present embodiment, an inspector may control whether to activate the detecting circuit 220 by sending a command to the controller 230 through a control interface (not shown) of the electronic apparatus 200. Namely, the controller 230 is to sent out the detecting-controlled signal S_DP for activating the detecting circuit 220 after receiving the command for executing the detection procedure, so that the detecting circuit 220 captures the power supply signal VP and accordingly generates the detecting result signal S_DR related to the configuration status of the RTC battery 212. In other words, before the controller 230 receives the command for executing the detection procedure, the detecting circuit 220 is maintained in a shut-down state, thereby causing no additional power consumption to the RTC battery 212.

Figure 3:
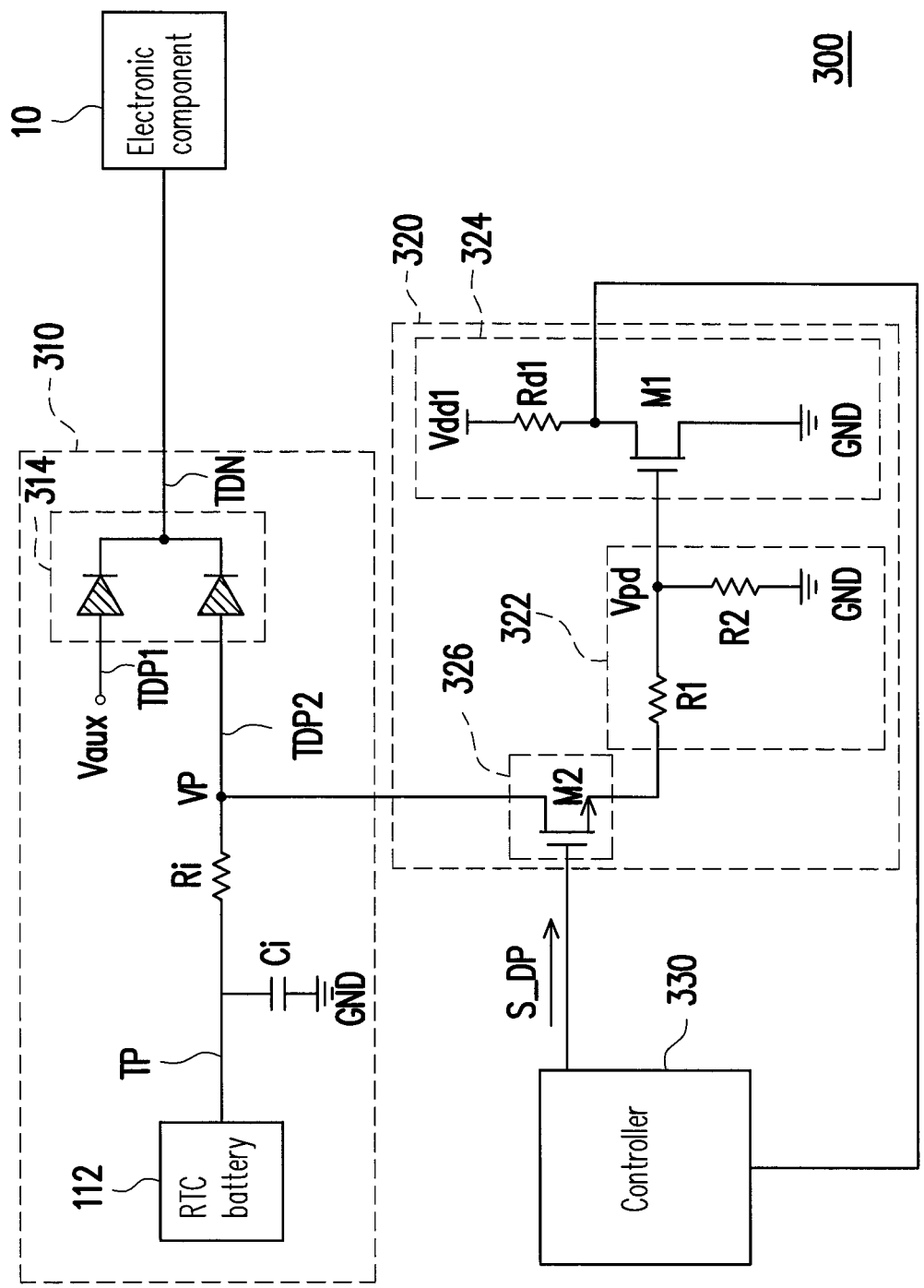
FIG. 3 is a schematic circuit diagram of a detecting circuit according to an embodiment of FIG. 2.
Figure 4:
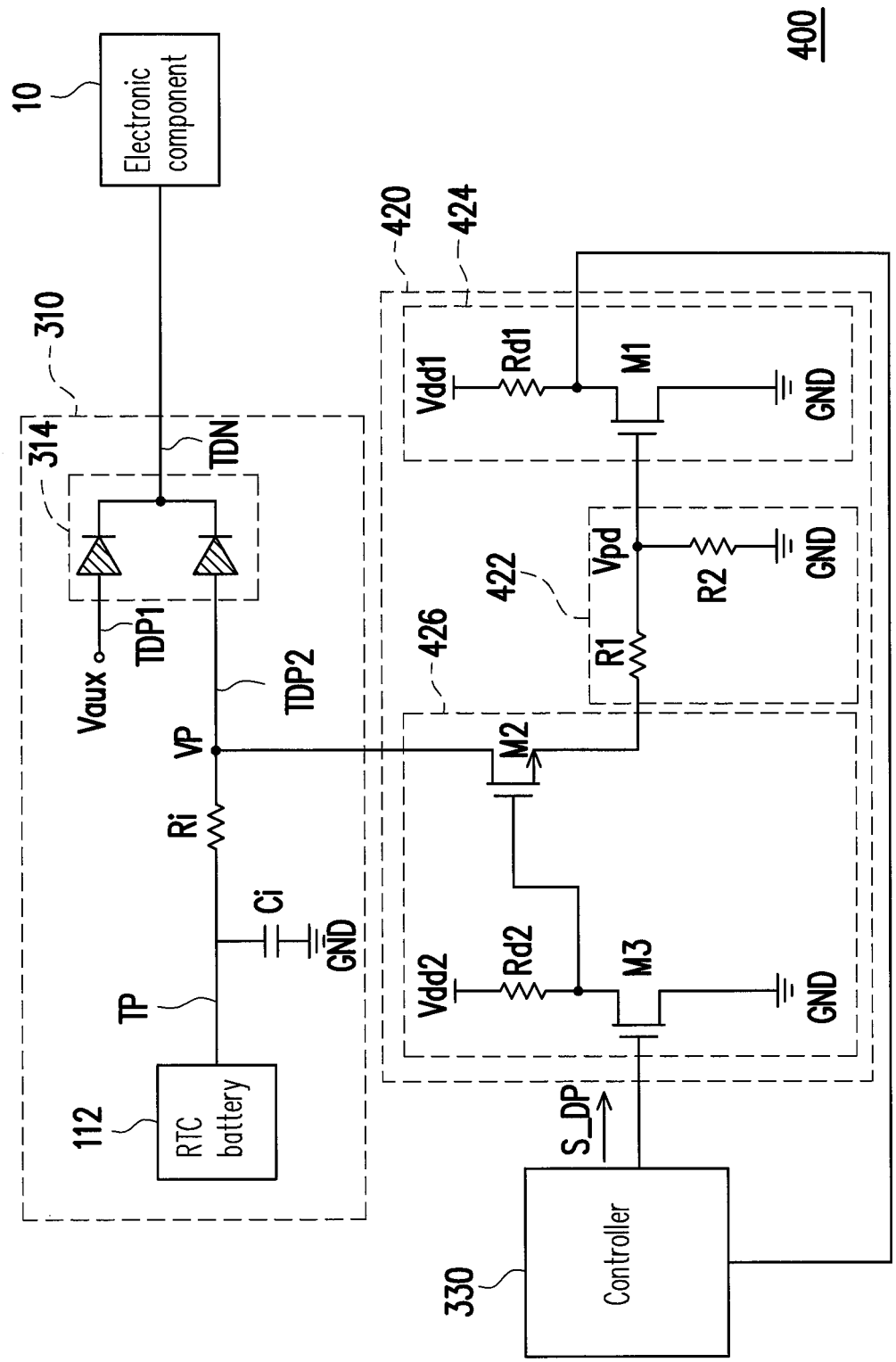
FIG. 4 is a schematic circuit diagram of a detecting circuit according to another embodiment of FIG. 2.

In the following below, embodiments shown in FIG. 3 and FIG. 4 are provided to further describe the specific implementation of the detecting circuit in the invention.

Referring to FIG. 3, wherein FIG. 3 is a schematic circuit diagram of a detecting circuit according to an embodiment of FIG. 2. An electronic apparatus 300 includes a battery module 310, a detecting circuit 320, a controller 330, and at least one electronic component (in the present embodiment, the electronic component 10 is also being taken as an example). In the present embodiment, the battery module 310 includes a RTC battery 312, a Schottky diode 314 and a corresponding external circuit (such as an input capacitor Ci and an input resistor Ri). The detecting circuit 320 includes a voltage dividing unit 322, an output unit 324 and a power capturing unit 326. Wherein, structures and functions of the battery module 310 and the controller 330 is substantially similar to that of the previous embodiment illustrated in FIG. 2, and thus descriptions regarding the battery module 210 and the controller 230 may be referred to the previous embodiment illustrated in FIG. 2, and are not to be repeated herein. In the following below, differences between the present embodiment and the previous embodiment, namely the parts regarding the detecting circuit 320, are further provided in detail.

In the detecting circuit 320 of the present embodiment, the voltage dividing unit 322 includes resistors R1 and R2. A first terminal of the resistor R1 couples to a source (viz., a second terminal of a transistor M2) of the transistor M2 of the power capturing unit 326. A first terminal of the resistor R2 couples to a second terminal of the resistor R1, and a second terminal of the resistor R2 couples to the ground terminal GND. Wherein, the resistors R1 and R2 constitute a dividing structure having a common node being used as a dividing point. Voltage on the dividing point is indeed the dividing signal Vpd.

The output unit 324 includes a bias source Vdd1, a bias resistor Rd1 and a transistor M1. A first terminal of the bias resistor Rd1 couples to the bias source Vdd1. A gate (viz. a control terminal of the transistor MA) of the transistor M1 couples to a common node (viz., the second terminal of the resistor R1 and the first terminal of the resistor R2) of the resistors R1 and R2 to receive the dividing signal Vpd. A drain (viz., a first terminal of the transistor M1) of the transistor M1 couples to a second terminal of the bias resistor Rd1 and the controller 330, and outputs the detecting result signal S_DR. While, a source (viz., a second terminal of the transistor M1) of the transistor M1 couples to the ground terminal GND.

The power capturing unit 326 includes the transistor M2. A gate (viz., a control terminal of the transistor M2) of the transistor M2 receives the detecting-controlled signal S_DP from the controller 330. A drain (viz., the first terminal of the transistor M2) of the transistor M2 couples to the power supply output terminal TP of the RTC battery 312 through the input resistor Ri to receive the power supply signal VP. While, the source of the transistor M2 couples to the first terminal of the resistor R1.

According to the structure of the present embodiment, when the controller 330 sends out the detecting-controlled signal S_DP having high level, the transistor M2 is turned-on in response to the detecting-controlled signal SDP, so that the power supply signal VP is provided to the first terminal of the resistor R1. Next, the resistors R1 and R2 divide the power supply signal VP to generate the dividing signal Vpd for controlling the on/off state of the transistor M1. Wherein, if the level of the dividing signal Vpd is greater than or equal to a threshold voltage of the transistor M1, then the transistor M1 is turned-on in response to the dividing signal Vpd and outputs the detecting result signal S_DR having low level (e.g., GND level) to the controller 330, so as to indicate that the RTC battery 312 is in the normal configuration state; contrarily, if the level of the dividing signal Vpd is smaller than the threshold voltage of the transistor M1, then the transistor M1 is turned-off and outputs the detecting result signal S_DR having high level (e.g., Vdd1 level) to the controller 330, so as to indicate that the RTC battery 312 is in the abnormal configuration state.

On the other hand, when the controller 330 sends out the detecting-controlled signal S_DP having low level, the transistor M2 is turned-off, so that the voltage dividing unit 322 and the output unit 324 at the backend do not respond to the operation of the power supply signal VP. In other words, the detecting circuit 320 is currently in the shut-down state.

In view of the above-descried circuit operation, if the inspector is to perform the detection procedure for detecting the configuration status of the RTC battery 312, the inspector may command the controller 330 to send out the detecting-controlled signal S_DP having high level, so that the detecting circuit 420 generates the corresponding detecting result signal S_DR according to the power supply signal VP. In addition, under the general condition of not performing the detection, the controller 330 may be commanded to maintain the detecting-controlled signal SDP at low level, so that the detecting circuit 320 is in the shut-down/non-operational state.

Referring to FIG. 4, wherein FIG. 4 is a schematic circuit diagram of a detecting circuit according to another embodiment of FIG. 2. An electronic apparatus 400 includes the battery module 310, a detecting circuit 420, the controller 330, and at least one electronic component (in the present embodiment, the electronic component 10 is also being taken as an example). In the present embodiment, structures and functions of the battery module 310 and a voltage dividing unit 422 and an output unit 424 in the detecting circuit 320 are substantially similar to that to the previous embodiment illustrated in FIG. 3, and thus are not to be repeated herein. In the following below, differences between the present embodiment and the previous embodiment, namely the parts regarding the power capturing unit 426, are further provided in detail.

In the detecting circuit 420 of the present embodiment, the power capturing unit 426 includes a bias source Vdd2, a bias resistor Rd2, the transistor M2 and a transistor M3. A first terminal of the bias resistor Rd2 couples to the bias source Vdd2. The gate of the transistor M2 couples to the second terminal of the bias resistor Rd2. The drain of the transistor M2 couples to the power supply output terminal TP of the RTC battery 312 to receive the power supply signal VP. While, the source of the transistor M2 couples to the first terminal of the resistor R1的 first terminal. A gate (viz., a control terminal of the transistor M3) of the transistor M3 receives detecting-controlled signal S_DP from the controller 330. A drain (viz., a first terminal of transistor M3) of the transistor M3 couples to the second terminal of the bias resistor Rd and the gate of the transistor M2. A source (viz., a second terminal of the transistor M3) transistor M3 couples to the ground terminal GND.

According to the structure of the present embodiment, when the controller 330 sends out the detecting-controlled signal S_DP having low level, the transistor M3 is turned-off in response to the detecting-controlled signal S_DP, so that the drain of the transistor M3 is maintained at high level due to the bias source Vdd2. Now, the transistor M2 is turned-on in response to a drain voltage of the transistor M3, so as to provide the power supply signal VP to the first terminal of the resistor R1. Next, the resistors R1 and R2 divide the power supply signal VP to generate the dividing signal Vpd for controlling the on/off state of the transistor M1, so that the transistor M1 determines the on/off state thereof based on the high and low level of the dividing signal Vpd, and accordingly generates the corresponding detecting result signal S_DR to the controller 330.

On the other hand, when the controller 330 sends out the detecting-controlled signal S_DP having high level, the transistor M3 is turned-on in response to the detecting result signal S_DP, so that a drain voltage of the transistor M3 is pulled-down to low level. Now, the transistor M2, in response to the drain voltage having low level, does not enable the voltage dividing unit 422 and the output unit 424 at the backend to respond to the operation of the power supply signal VP. In other words, the detecting circuit 420 is currently in the shut-down state.

In view of the above-descried circuit operation, if the inspector perform the detection procedure for detecting the configuration status of the RTC battery 312, the inspector may command the controller 330 to send out the detecting-controlled signal S_DP having low level, so that the detecting circuit 420 generates the corresponding detecting result signal S_DR according to the power supply signal VP. In addition, under the general condition of not performing the detection, the controller 330 may be commanded to maintain the detecting-controlled signal S_DP at high level, so that the detecting circuit 420 is in the shut-down/non-operational state.

As compared to the power capturing unit 326 of the previous embodiment, the power capturing unit 426 of the present embodiment further includes an additionally stage of transistor switch, so as to avoid the power supply of the battery module 310 from causing unintended effects to the controller 330.

It is to be noted that, even though the transistors M1 to M3 of the previous embodiment are, for example, N-type transistors, but the invention is not limited thereto. In other embodiments, the transistors M1 to M3 may also be implemented with P-type transistors. It is to be firstly explained that, under the implementation of employing the P-type transistor, the first terminal of the transistor is referred to the source of the P-type transistor, and the second terminal of the transistor is referred to the drain of the P-type transistor.

Figure 5:
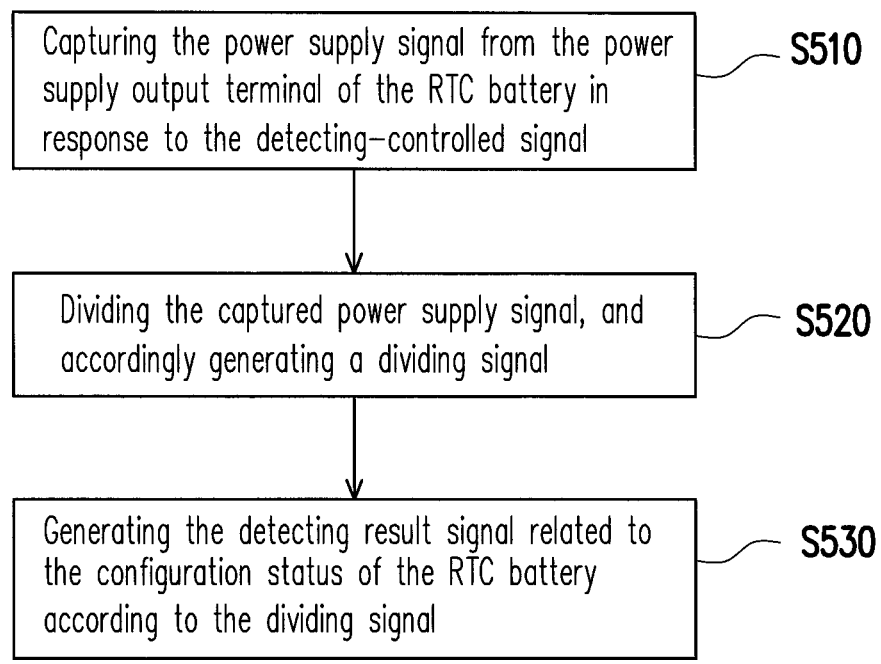
FIG. 5 is a flowchart illustrating the steps of a configuration status detecting method of a RTC battery according to an embodiment of the invention.

FIG. 5 is a flowchart illustrating the steps of a configuration status detecting method of a RTC battery according to an embodiment of the invention. A configuration status detecting method of the RTC battery of the present embodiment may be applied to the electronic apparatus 200, 300 or 400 of the previous embodiment. Referring to FIG. 5, the configuration status detecting method includes the following steps: capturing the power supply signal from the power supply output terminal of the RTC battery (i.e., 212, 312) in response to the detecting-controlled signal (step S510); dividing the captured power supply signal, and accordingly generating a dividing signal (step S520); and generating the detecting result signal related to the configuration status of the RTC battery according to the dividing signal (step S530).

More specifically, the above-mentioned operation of generating the detecting result signal related to the configuration status of the RTC battery according to the dividing signal (step S530) may be attained by the following steps: determining whether the level of the dividing signal is greater than or equal to the threshold; if the level of the dividing signal is greater than or equal to the threshold, outputting the enabled detecting result signal, wherein the enabled detecting result signal indicates that the RTC battery is in the normal configuration state; and if the level of the dividing signal is smaller than the threshold, outputting the disabled detecting result signal, wherein the disabled detecting result signal indicates that the RTC battery is in the abnormal configuration state.

Wherein, the power supply method illustrated by embodiment of FIG. 5 may be adequately supported and taught in accordance to the descriptions of FIG. 1 to FIG. 4 provide in the above, and thus similar or overlapping parts are not to be repeated herein.

In summary, the embodiments of the invention provide the detecting circuit and the configuration status detecting method of the RTC battery and the electronic apparatus using the same. The detecting circuit may be used to detect whether the RTC battery is correctly configured in the electronic apparatus, so that the inspector is not required to confirm the configuration status of the RTC battery through a complicated teardown inspection procedure, thereby improving the efficiency of a testing process. In addition, since the detecting circuit uses the power supply signal being divided as a basis for determining whether the RTC battery is correctly configured in the electronic apparatus, false determination due to reverse leakage from the Schottky diode in the battery module may be avoided, thus improving the detection accuracy.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A detecting circuit of a Real-Time Clock (RTC) battery, comprising:
    a power capturing unit coupled to a power supply output terminal of the RTC battery, receiving a detecting-controlled signal and capturing a power supply signal from the power supply output terminal in response to the detecting-controlled signal, wherein the power capturing unit provides the power supply signal when the detecting-controlled signal having high level, and the power capturing unit stops to provide the power supply signal when the detecting-controlled signal having low level;
    a voltage dividing unit coupled to the power capturing unit and configured to divide the power supply signal captured by the power capturing unit to generate a dividing signal; and
    an output unit coupled to the voltage dividing unit to receive the dividing signal, wherein the output unit generates a detecting result signal related to a configuration status of the RTC battery according to the dividing signal,
    wherein the voltage dividing unit comprises:
        a first resistor, a first terminal thereof coupled to the power capturing unit; and
        a second resistor, a first terminal thereof coupled to a second terminal of the first resistor, and a second terminal thereof is coupled to a ground terminal,
    wherein the output unit comprise:
        a first bias source;
        a first bias resistor, a first terminal thereof coupled to the first bias source; and
        a first transistor, a control terminal thereof coupled to the second terminal of the first resistor and the first terminal of the second resistor, a first terminal thereof coupled to a second terminal of the first bias resistor and outputting the detecting result signal, and a second terminal thereof coupled to the ground terminal,
    wherein the power capturing unit comprises:
        a second transistor, a control terminal thereof receiving the detecting-controlled signal, a first terminal thereof coupled to the power supply output terminal to receive the power supply signal, and a second terminal thereof coupled to the first terminal of the first resistor.

2. The detecting circuit of the RTC battery as recited in claim 1, wherein:
    if the level of the dividing signal is greater than or equal to a threshold, the output unit outputs the enabled detecting result signal in response to the dividing signal, wherein the enabled detecting result signal indicates that the RTC battery is in a normal configuration state; and
    if the level of the dividing signal is smaller than the threshold, the output unit outputs the disabled detecting result signal in response to the dividing signal, wherein the disabled detecting result signal indicates that the RTC battery is in an abnormal configuration state.

3. The detecting circuit of the RTC battery as recited in claim 1, wherein the power supply output terminal of the RTC battery is adapted to be coupled to a Schottky diode, so as to supply power to at least one electronic component via the Schottky diode.

4. An electronic apparatus, comprising:
    at least one electronic component;
    a battery module adapted to supply power to the at least one electronic component, wherein the battery module comprises:
        a Real-Time Clock battery (RTC) having a power supply output terminal; and
        a Schottky diode coupled between the power supply output terminal and the at least one electronic component;
    a detecting circuit coupled to the battery module, wherein the detecting circuit comprises:
        a power capturing unit coupled to a power supply output terminal of the RTC battery, receiving a detecting-controlled signal and capturing a power supply signal from the power supply output terminal in response to the detecting-controlled signal, wherein the power capturing unit provides the power supply signal when the detecting-controlled signal having high level, and the power capturing unit stops to provide the power supply signal when the detecting-controlled signal having low level;
        a voltage dividing unit coupled to the power capturing unit and configured to divide the power supply signal captured by the power capturing unit to generate a dividing signal; and
        an output unit coupled to the voltage dividing unit to receive the dividing signal, wherein the output unit generate a detecting result signal according to the dividing signal; and
    a controller configured to provide the detecting-controlled signal for controlling the operation of the detecting circuit and to receive the detecting result signal for determining a configuration status of the RTC battery,
    wherein the voltage dividing unit comprises:
        a first resistor, a first terminal thereof coupled to the power capturing unit; and
        a second resistor, a first terminal thereof coupled to a second terminal of the first resistor, and a second terminal thereof is coupled to a ground terminal,
    wherein the output unit comprises:
        a first bias source; and
        a first transistor, a control terminal thereof coupled to the second terminal of the first resistor and the of the first terminal of the second resistor, a first terminal thereof coupled to the first bias source and outputting the detecting result signal, and a second terminal thereof coupled to the ground terminal,
    wherein the power capturing unit comprises:
        a second transistor, a control terminal receiving the detecting-controlled signal, a first terminal thereof coupled to the power supply output terminal to receive the power supply signal, and a second terminal thereof coupled to the first terminal of the first resistor.

5. The electronic apparatus as recited in claim 4, wherein the Schottky diode has a first anode terminal, a second anode terminal and a cathode terminal, the first anode terminal couples to an auxiliary bias source, the second anode terminal couples to the power supply output terminal, and the cathode terminal couples to the at least one electronic component.

6. The electronic apparatus as recited in claim 4, wherein:
if the level of the dividing signal is greater than or equal to a threshold, the output unit outputs the enabled detecting result signal in response to the dividing signal, wherein the controller determines that the RTC battery is in a normal configuration state according to the enabled detecting result signal; and
if the level of the dividing signal is smaller than the threshold, the output unit outputs the disabled detecting result signal in response to the dividing signal, wherein the controller determines that the RTC battery is in an abnormal configuration state according to the disabled detecting result signal.

7. A detecting circuit of a Real-Time Clock (RTC) battery, comprising:
a power capturing unit coupled to a power supply output terminal of the RTC battery, receiving a detecting-controlled signal and capturing a power supply signal from the power supply output terminal in response to the detecting-controlled signal, wherein the power capturing unit provides the power supply signal when the detecting-controlled signal having high level, and the power capturing unit stops to provide the power supply signal when the detecting-controlled signal having low level;
a voltage dividing unit coupled to the power capturing unit and configured to divide the power supply signal captured by the power capturing unit to generate a dividing signal; and
an output unit coupled to the voltage dividing unit to receive the dividing signal, wherein the output unit generates a detecting result signal related to a configuration status of the RTC battery according to the dividing signal,
wherein the voltage dividing unit comprises:
a first resistor, a first terminal thereof coupled to the power capturing unit; and
a second resistor, a first terminal thereof coupled to a second terminal of the first resistor, and a second terminal thereof is coupled to a ground terminal,
wherein the output unit comprise:
a first bias source;
a first bias resistor, a first terminal thereof coupled to the first bias source; and
a first transistor, a control terminal thereof coupled to the second terminal of the first resistor and the first terminal of the second resistor, a first terminal thereof coupled to a second terminal of the first bias resistor and outputting the detecting result signal, and a second terminal thereof coupled to the ground terminal,
wherein the power capturing unit comprises:
a second bias source;
a second bias resistor, a first terminal thereof coupled to the second bias source;
a second transistor, a control terminal thereof coupled to the second terminal of the second bias resistor, a first terminal thereof coupled to the power supply output terminal to receive the power supply signal, and a second terminal thereof coupled to the first terminal of the first resistor; and
a third transistor, a control terminal thereof receiving the detecting-controlled signal, a first terminal thereof coupled to the second terminal of the second bias resistor and the control terminal of the second transistor, and a second terminal thereof coupled to the ground terminal.

8. An electronic apparatus, comprising:
at least one electronic component;
a battery module adapted to supply power to the at least one electronic component, wherein the battery module comprises:
a Real-Time Clock battery (RTC) having a power supply output terminal; and
a Schottky diode coupled between the power supply output terminal and the at least one electronic component;
a detecting circuit coupled to the battery module, wherein the detecting circuit comprises:
a power capturing unit coupled to a power supply output terminal of the RTC battery, receiving a detecting-controlled signal and capturing a power supply signal from the power supply output terminal in response to the detecting-controlled signal, wherein the power capturing unit provides the power supply signal when the detecting-controlled signal having high level, and the power capturing unit stops to provide the power supply signal when the detecting-controlled signal having low level;
a voltage dividing unit coupled to the power capturing unit and configured to divide the power supply signal captured by the power capturing unit to generate a dividing signal; and
an output unit coupled to the voltage dividing unit to receive the dividing signal, wherein the output unit generate a detecting result signal according to the dividing signal; and
a controller configured to provide the detecting-controlled signal for controlling the operation of the detecting circuit and to receive the detecting result signal for determining a configuration status of the RTC battery,
wherein the voltage dividing unit comprises:
a first resistor, a first terminal thereof coupled to the power capturing unit; and
a second resistor, a first terminal thereof coupled to a second terminal of the first resistor, and a second terminal thereof is coupled to a ground terminal,
wherein the output unit comprises:
a first bias source;
a first bias resistor, a first terminal thereof coupled to the first bias source; and
a first transistor, a control terminal thereof coupled to the second terminal of the first resistor and the first terminal of the second resistor, a first terminal thereof coupled to a second terminal of the first bias resistor and outputting the detecting result signal, and a second terminal thereof coupled to the ground terminal,
wherein the power capturing unit comprises:
a second bias source;
a second bias resistor, a first terminal thereof coupled to the second bias source;
a second transistor, a control terminal thereof coupled to a second terminal of the second bias resistor, a first terminal thereof coupled to the power supply output terminal to receive the power supply signal, and a second terminal thereof coupled to the first terminal of the first resistor; and
a third transistor, a control terminal thereof receiving the detecting-controlled signal, a first terminal thereof coupled to the second terminal of the second bias resistor and the control terminal of the second transistor, and a second terminal thereof coupled to the ground terminal.

\* \* \* \* \*